(12) United States Patent
Molnar et al.

(10) Patent No.: US 6,370,372 B1
(45) Date of Patent: Apr. 9, 2002

(54) SUBHARMONIC MIXER CIRCUIT AND METHOD

(75) Inventors: Alyosha C. Molnar, Costa Mesa; Rahul Magoon, Irvine, both of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/668,879

(22) Filed: Sep. 25, 2000

(51) Int. Cl.⁷ .................................................. H04B 1/30
(52) U.S. Cl. .......................... 455/323; 455/326; 455/333
(58) Field of Search ................................ 455/318, 319, 455/323, 324, 325, 326, 330, 333; 327/113, 355, 356, 357, 358, 359

(56) References Cited

U.S. PATENT DOCUMENTS

| | | | |
|---|---|---|---|
| 5,127,102 A | 6/1992 | Russell | 455/327 |
| 5,517,687 A | 5/1996 | Niehenke et al. | 455/325 |
| 5,697,093 A | * 12/1997 | Cusdin et al. | 455/324 |
| 5,761,615 A | * 6/1998 | Jaffee | 455/324 |
| 5,826,182 A | 10/1998 | Gilbert | 455/326 |

OTHER PUBLICATIONS

Sheng, et al., "A SI/SIGE HBT Sub–Harmonic Mixer/DownConverter", Proceedings of the 1999 Bipolar/BiCMOS Circuits and Technology Meeting, Minneapolis, MN, Sep. 26–28, 1999, pp. 71–74.

Yamaji, et al., "An I/Q Active Balanced Harmonic Mixer with IM2 Cancelers and a 45° Phase Shifter", IEEE Journal of Solid–State Circuits, vol. 33, No. 12, Dec. 1998, pp. 2240–2246.

* cited by examiner

Primary Examiner—Thanh Cong Le
(74) Attorney, Agent, or Firm—Welsh & Katz, Ltd.

(57) ABSTRACT

A subharmonic mixer that has two switching stages is used to improved mixer gain in a direct downconversion receiver. The first switching stage mixes a received RF signal to an intermediate frequency that is one-half the received RF signal frequency. The second switching stage mixes the intermediate frequency to baseband. By connecting the two switching stages in series, current is reused and harmonic content from the first stage is fed into the second stage thereby improving the mixer gain.

26 Claims, 4 Drawing Sheets

SUBHARMONIC MIXER CIRCUIT AND METHOD

BACKGROUND OF THE INVENTION

1. Field of the Invention

This invention relates generally to radio frequency (RF) receivers and, more particularly, to RF mixers.

2. Related Art

To optimally process radio frequency (RF) signals, most RF receivers convert received RF signals to lower frequencies termed baseband frequencies. The filtering and amplification performed in processing the RF signal at baseband requires less expensive electrical components than those required for accurate processing at RF. Further, these signal processing components perform best at baseband and thus are able to improve RF receiver gain, dynamic range and stability.

Typically, RF receivers employ mixers to convert the received RF signal to a lower frequency while conserving the modulation information contained in the received signal. Frequency shifting occurs by mixing, or taking the difference between, the received RF signal and a reference frequency from a local oscillator (LO). The difference between the RF signal and the LO frequency is the lower frequency or baseband frequency.

The process of converting the RF signal to a lower frequency is called downconverting. The RF receiver functions to downconvert a received RF signal to baseband. Direct conversion or homodyne receivers directly downconvert the received RF signal to baseband by mixing the received RF signal with a LO frequency equal to the received RF frequency.

An example of a prior art mixer, commonly known as a "Gilbert cell," is shown in FIG. 1. The mixer includes transistors Q0–Q3 and a RF input section using transistors Q4, Q5. Input to the Gilbert cell is a LO voltage where the oscillation of the LO voltage causes a current to commutate between the pair Q0, Q2 and the pair Q1, Q3. This commutation action produces a mixing of the RF signal with the local oscillator signal to produce an output baseband signal that is a downconverted received RF signal. Further, a Gilbert cell often employs a diode predistortion circuit to linearize the upper quad of transistors, as shown in FIG. 2. The diode predistortion circuit includes transistors Q6–Q9.

Since a direct conversion receiver, as shown in FIG. 3, directly mixes (often using Gilbert cells as shown in FIGS. 1 and 2) the received RF signal with the LO signal, the LO signal leaks through the RF signal input port of the mixer, as shown in FIG. 3, and may be reflected at the antenna. The reflected LO signal is indistinguishable from the received RF signal, and so is downconverted at the mixer by the LO signal present on the mixer's LO port and "self-mixed". Self mixing results in a dc offset, which distorts the processing of the received RF signal. Thus, the sensitivity of the RF receiver may be limited by the reflected LO signal. Further, the ability to shift a signal in frequency with minimal added distortion may be important because the RF receiver may be frequency dependent. RF receivers must properly downconvert to effectively perform.

One approach to the problem of self-mixing can be to use a heterodyne receiver. As shown in FIG. 4, a heterodyne receiver performs downconversion in two stages using two mixers. A first mixer 402 converts the received RF frequency to an intermediate frequency (IF), which is not equal to the received RF frequency. The IF signal is amplified in a low noise amplifier 403 and then a second mixer 404 downconverts the IF to baseband. Since the downconversion may be performed in two stages, heterodyne receivers do not suffer from the "self-mixing" problem. However, using a heterodyne receiver implementation requires using more discrete components, which translates into higher-cost RF receivers.

Another approach to the problem of self-mixing may be to use a low-IF receiver architecture. A low-IF receiver performs downconversion by using a single mixer stage to frequency translate the received signal to a low intermediate frequency which is typically on the order of one or two channel bandwidths. Then, the signal may be passed through an analog-to-digital converter (ADC) where a digital multiplication may be performed. Finally, image rejection filtering may be performed to remove imageband attenuation. Since the downconversion may be performed to a low-IF, low-IF receivers do not suffer from the "self-mixing" problem. However, using a low-IF implementation requires image rejection components that add to the cost and expense of RF receiver design.

Since a direct conversion receiver can be a preferred approach to RF receivers in some applications, an improved direct conversion receiver which downconverts without an unwanted dc offset is needed.

SUMMARY

Under one embodiment of the invention, a subharmonic mixer that includes a mixer core of two switching stages and a RF input section is presented. The mixer core has a LO interface for receiving a local oscillator signal, a BB output for providing a BB output signal, and first and second inputs for connecting to an RF input section. The RF input section includes a current mode signal and a RF input for receiving a RF input signal. The RF input section includes a first transistor having a first terminal coupled to the first input of the mixer core to supply a first current and the first current responsive to the RF input signal, a second transistor having a second terminal coupled to the second input of the mixer core to supply a second current and the second current responsive to the RF input signal. As will be shown, the RF input section may take many forms.

The mixer core of two switching stages includes a first switching stage of four transistors connected as a doubly-balanced mixer coupled in series with a second switching stage of four transistors connected as a doubly balanced mixer. The first switching stage includes two input terminals, each connected to the base of a respective transistor in a differential pair, to which a LO voltage is applied and two output terminals, each connected to the input of the second switching stage. The second switching stage also includes two input terminals, each connected to the base of a respective transistor in a differential pair, to which a LO voltage is applied.

Under another embodiment of the invention a circuit is provided that improves mixer gain by utilizing two switching stages in a direct downconversion receiver. The first switching stage mixes a received RF signal to an intermediate frequency that may be approximately one-half the received RF signal frequency. The second switching stage mixes the intermediate frequency to baseband. By connecting the two switching stages in series, current may be reused and harmonic content from the first stage may be fed into the second stage thus improving the mixer gain.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The components in the figures are not necessarily to scale, emphasis instead being placed upon illustrating the principles of the invention. In the figures, like reference numerals designate corresponding parts throughout the different views.

DETAILED DESCRIPTION

Figure 5:
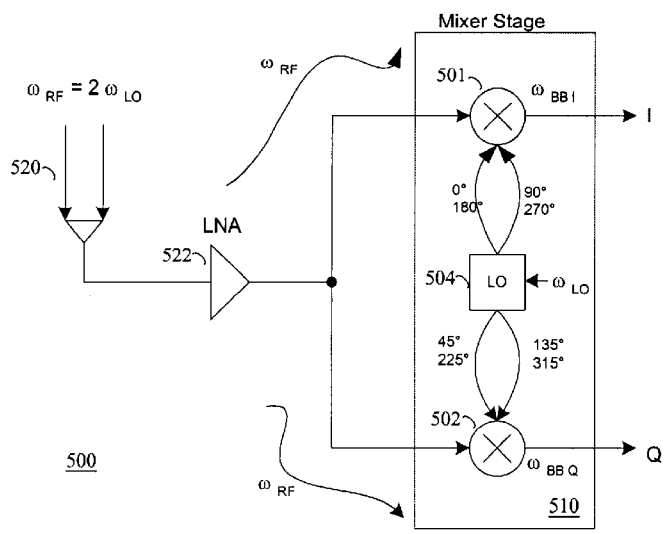
FIG. 5 is an illustration of an example of a direct downconversion receiver implemented with a subharmonic mixer.

An example of a subharmonic mixer stage 510 incorporated into a direct conversion receiver system 500 is shown in FIG. 5. The receiver system 500 functions to isolate a received signal 520. After an initial amplification of the received signal 520 by a low noise amplifier (LNA) 522, the entire signal spectrum (termed $\omega_{RF}$) is frequency translated to baseband (termed $\omega_{BB}$) by a mixer stage 510 utilizing a local oscillator (LO) 504 and two subharmonic mixers 501, 502. Each subharmonic mixer (501 or 502) effectively works as two switching stages in series. By varying the phase of the LO 504 signal, $\omega_{LO}$, and mixing $\omega_{LO}$ with $\omega_{RF}$, the first stage translates the received signal 520 to an intermediate frequency $\omega_{IF}$. The second stage translates the intermediate frequency $\omega_{IF}$ to baseband by mixing the LO 504 signal shifted by 90° with the intermediate frequency to produce $\omega_{BB}$. Further, varying the phase of the local oscillator 504 signal, $\omega_{LO}$, used for mixer 501 by a LO oscillator 504 signal that is approximately 45° out of phase for mixer 502 allows alternating inphase (I) and quadrature (Q) components to be derived from the received 520 signal. By mixing the local oscillator 504 signal $\omega_{LO}$ (and its phase components at approximately 0° and 45°) with the received signal 520, the received signal is frequency translated into alternating I (termed $\omega_{BB\ I}$) and Q (termed $\omega_{BB\ Q}$) baseband components. After the received signal is frequency translated, further processing may take place. For a more detailed discussion of radio frequency receivers, reference may be made to readily available RF system design books as are well known in the art.

Both subharmonic mixers 501, 502 in FIG. 5 are driven by a LO 504 signal whose frequency is approximately half of the frequency driving the conventional downconversion mixer. Prior art mixers are driven by LO signals at 0° and 90°, whereas subharmonic mixers 501, 502 are driven by LO signals at 0° and 45°. Even though subharmonic mixers 501, 502 are driven by a LO signal whose frequency is approximately halved, the output of the mixer stage 510 still produces I and Q baseband components that are 90° out of phase with respect to each other. The process of performing two switching operations causes the frequency to double and thereby the phase is doubled. Even though the LO signal is input at 0° and 45° to subharmonic mixers 501, 502, respectively, the outputs of the mixer stage 510 are I and Q components that are 900 out of phase, as desired.

As shown in FIG. 5, a local oscillator 504 provides two inputs to the subharmonic mixer 501 and two inputs to the subharmonic mixer 502. Input to the first subharmonic mixer 501 is the local oscillator signal $\omega_{LO}$ and the input signal $\omega_{RF}$. The local oscillator signal, $\omega_{LO}$, includes phase components $\omega_{LO}(0°)$, $\omega_{LO}(90°)$, $\omega_{LO}(180°)$ and $\omega_{LO}(270°)$. Mixing these phase components of $\omega_{LO}$ with $\omega_{RF}$ produces the I baseband component $\omega_{BB\ I}$). Input to the second subharmonic mixer 502 is the phase shifted local oscillator signal at a phase sift of approximately 45° (used herein as $\omega_{LO}(45°)$) and the input signal $\omega_{RF}$. Mixing $\omega_{LO}(45°)$ and its ninety degree phase components $\omega_{LO}(135°)$, $\omega_{LO}(225°)$ and $\omega_{LO}(315°)$ with $\omega_{RF}$ produces the Q baseband component $\omega_{BB\ Q}$).

Figure 6:
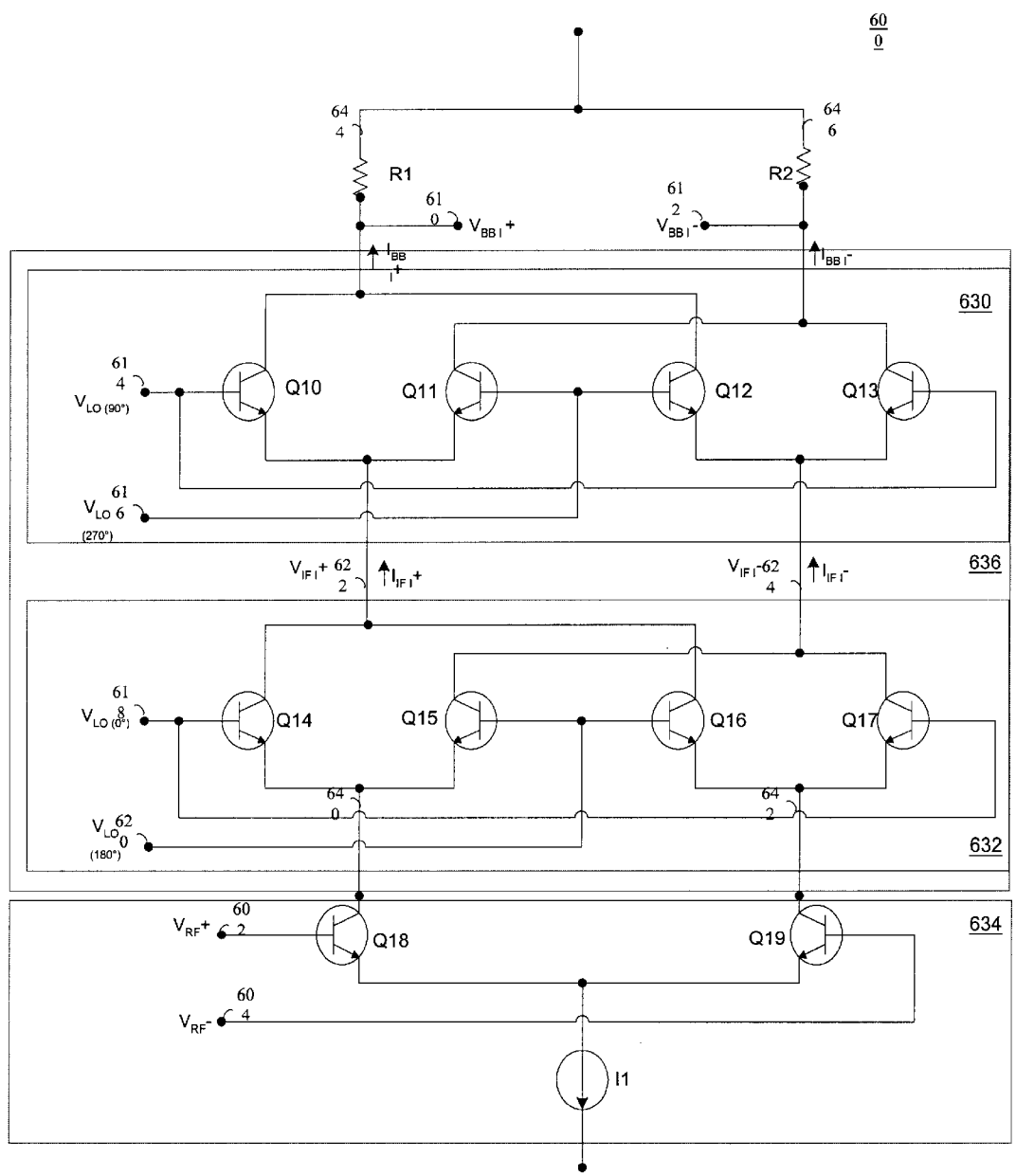
FIG. 6 is an illustration of an example of a subharmonic mixer suitable for generation of the Inphase frequency in the receiver of FIG. 5.

FIG. 6 is a schematic circuit diagram of an example implementation of the subharmonic mixer 501 shown in FIG. 5. Subharmonic mixer 600 of FIG. 6 is commonly referred to as a "I-mixer" since it produces the I baseband $\omega_{BB\ I}$) component of the received signal, $\omega_{RF}$. The subharmonic mixer 600 shown includes a RF input section 634 and a mixer core 636. The mixer core 636 includes a LO interface for receiving a LO signal and includes two switching stages 630, 632 for providing an output baseband (BB) signal. The RF input section 634 is coupled to the mixer core 636 at a first input 640 for supplying a first current to a first differential pair Q14, Q15 and a second input 642 for supplying a second current to a second differential pair Q16, Q17 of the first stage 632 of the mixer core 636. The first switching stage 632 of the mixer core includes the four transistors Q14–Q17 with inputs 618, 620. The first switching stage 632 is coupled to the second stage 630 of the mixer core 636 at third input 622 for supplying a third current to a third differential pair Q10, Q11 and a fourth input 624 for supplying a fourth current to a fourth differential pair Q12, Q13. The second switching stage 630 of the mixer core includes four transistors Q10–Q13 with inputs 614, 616 for providing an output baseband signal at outputs 610, 612.

In general, the mixer 600 works by switching current between differential transistor pairs in each switching stage 630, 632. Transistors Q10–13 are commonly considered a "Gilbert cell" and the same is true for transistors Q14–Q17. Thus, the illustrated I-mixer core 636 can be considered to include two Gilbert cells in series.

In the illustrated embodiment of FIG. 6, the received signal, $\omega_{RF}$, is input to the transistors Q18 and Q19 as $V_{RF}+$ and $V_{RF}-$ at inputs 602, 604 respectively and is converted to current flow in the collectors of transistors Q18 and Q19. This current flow is mixed with LO components in the first switching stage 632 to produce a current which is at an intermediate frequency (IF). Switching occurs when $V_{LO\ (0°)}$ from the input 618 is much greater than $V_{LO\ (180°)}$ from the input 620 so that the transistors Q14 and Q16 steer the current $I_{IF\ I}+$ to current branch 622; otherwise the current is steered to current branch 624 and is current $I_{IF\ I}-$. Switching is essentially a multiplying action that mixes down the input signal to a lower frequency. The current at the intermediate frequency is mixed with LO components in the second switching stage 630 to produce the I baseband component.

Switching occurs in the second stage 630 when $V_{LO\ (90°)}$ from input 614 is much greater than $V_{LO\ (270°)}$ from input 616 so that transistors Q10 and Q12 steer the current $I_{BB\ I}+$ to current branch 644; otherwise, the current $I_{BB\ I}-$ is steered to current branch 646. Using the resistors R1 and R2 the currents, $I_{BB\ I}+$ and $I_{BB\ I}-$ are converted to voltage at outputs 610, 612.

Figure 7:
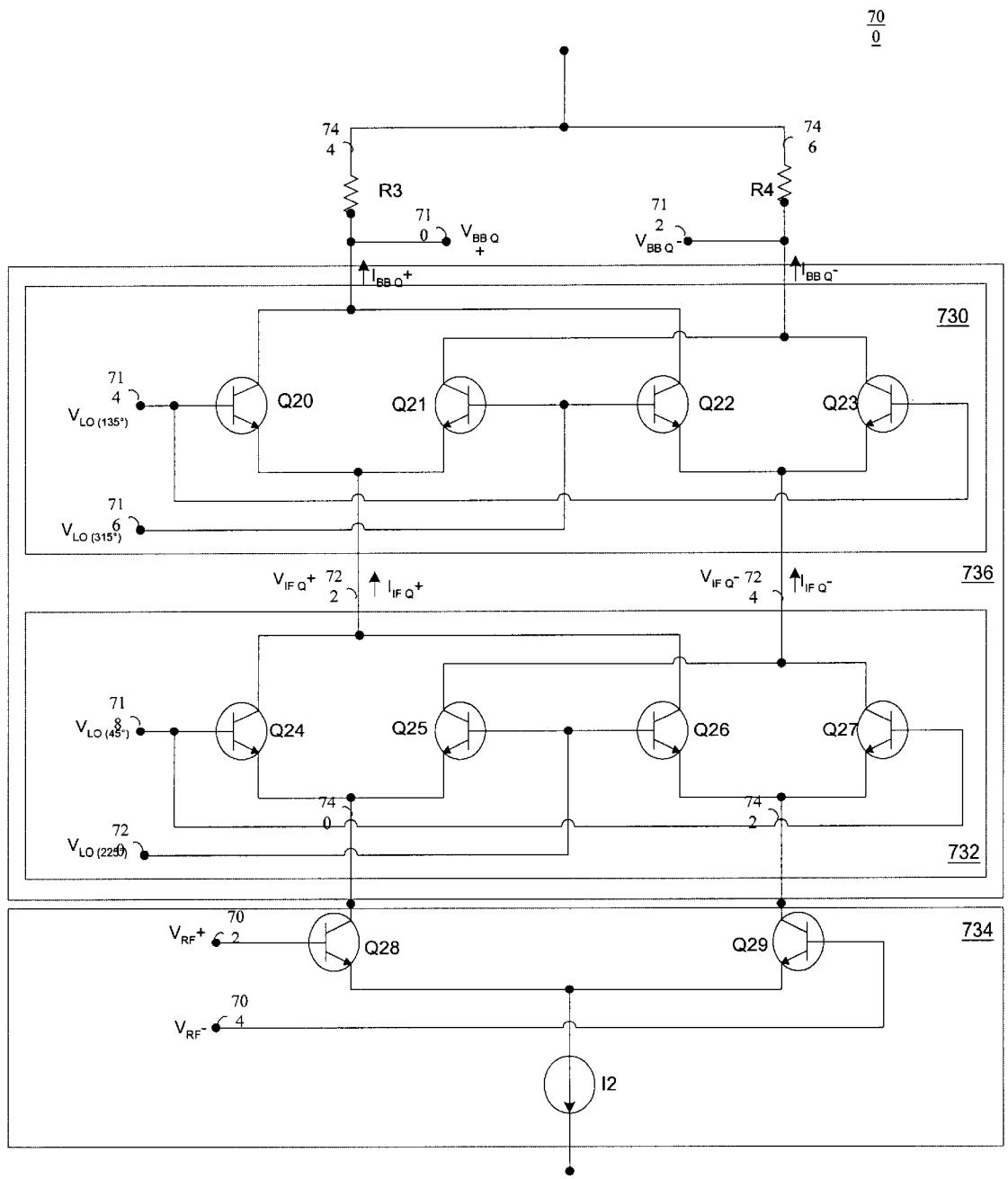
FIG. 7 is an illustration of an example of a subharmonic mixer suitable for generation of the Quadrature frequency in the receiver of FIG. 5.

FIG. 7 is a schematic circuit diagram of an example implementation of the subharmonic mixer 502 as shown in FIG. 5. Subharmonic mixer 700 of FIG. 7 is commonly referred to as a "Q-mixer" since it produces the Q baseband ($\omega_{BB\ Q}$) component of the received signal, $\omega_{RF}$. The subharmonic mixer 700 shown includes a RF input section 734 and a mixer core 736. The mixer core 736 includes a LO interface for receiving a LO signal and includes two switching stages 730, 732 for providing an output baseband signal. The RF input section 734 is coupled to the mixer core 736 at a first input 740 for supplying a first current to a first differential pair Q24, Q25 and a second input 742 for supplying a second current to a second differential pair Q26, Q27 of the first stage 732 of the mixer core 736. The first switching stage 732 of the mixer core 736 includes the four transistors Q24–Q27 with inputs 718, 720. The first switching stage 732 is coupled to the second stage 730 of the mixer core 736 at third input 722 for supplying a third current to a third differential pair Q10, Q11 and a fourth input 724 for supplying a fourth current to a fourth differential pair Q12, Q13. The second switching stage 730 of the mixer core 736 includes four transistors Q10–Q13 with inputs 714, 716 for providing an output baseband signal at outputs 710, 712.

In general, as with the I-mixer, the Q-mixer 700 works by switching current between differential transistor pairs in each switching stage 730, 732. Transistors Q20–Q23 are commonly considered a "Gilbert cell" and the same is true for transistors Q24–Q27. Thus, the illustrated Q-mixer core 736 can be considered to include two Gilbert cells in series.

In the illustrated embodiment of FIG. 7, the received signal, $\omega_{RF}$, is input to the transistors Q28 and Q29 as $V_{RF}+$ and $V_{RF}-$ at inputs 702, 704 respectively and is converted to current flow in the collectors of Q28 and Q29. This current flow is mixed with LO components in the first switching stage 732 to produce a current which is at an intermediate frequency. Switching occurs when $V_{LO\ (45°)}$ from the input 718 is much greater than $V_{LO\ (225°)}$ from the input 720 so that transistors Q24 and Q26 steer the current to $I_{IF\ Q}+$ to current branch 722; otherwise the current is steered to current branch 724 and is current $I_{IF\ Q}-$. The current at the intermediate frequency is mixed with LO components in the second switching stage 730 to produce the Q baseband component. Switching also occurs when $V_{LO\ (135°)}$ from input 714 is much greater than $V_{LO\ (315°)}$ from input 716 so that transistors Q20 and Q22 steer the current $I_{BB\ Q}+$ to current branch 744; otherwise, the current $I_{BB\ Q}-$ is steered to current branch 746. Using resistors R3 and R4, the currents $I_{BB\ Q}+$ and $I_{BB\ Q}-$ are converted to voltage at outputs 710, 712.

The phase components of the LO signal, $\omega_{LO}$ are input to inputs 614–620 and 714–720 of the first and second switching stages of each mixer 600, 700. In the prior art, $\omega_{LO}$ is input at the same frequency as $\omega_{RF}$, whereas in subharmonic mixers 600, 700, $\omega_{LO}$ is input at approximately half the frequency of $\omega_{RF}$. For the I-mixer 600 of FIG. 6, the LO signal that is applied to the second switching stage 630 at inputs 614, 616 is shifted by 90° and 270° and the LO signal that is applied to the first switching stage 632 at inputs 618, 620 is shifted 0° and 180° in phase. For the Q-mixer 700 of FIG. 7, the LO signal that is applied to the second switching stage 730 at inputs 714, 716 is shifted by 135° and 315° and the LO signal that is applied to the first switching stage 732 at inputs 718, 720 is shifted by 45° and 225°. As mentioned, both stages are driven by a LO signal whose frequency is approximately half of the frequency driving the conventional downconversion mixer.

The operation of subharmonic mixer 600 can be described in greater detail with reference to Equation (1) below which relates the output, $V_{BB\ I}$ to inputs, $V_{RF}$ and $V_{LO}$.

$$V_{BB\ I}(t) = V_{RF}(t) * V_{LO(0°)}(t) * V_{LO\ (90°)}(t) \quad \text{Equation 1}$$

Figure 1:
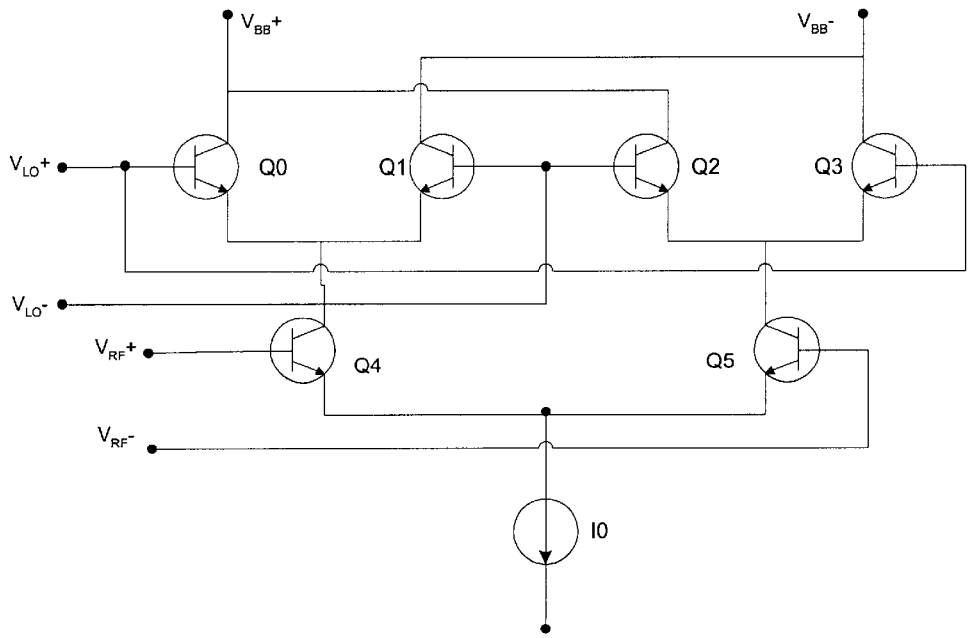
FIG. 1 is an illustration of a prior art Gilbert cell used in RF receivers.

Note that $V_{LO(0°)}$ and $V_{LO(90°)}$ are the voltages driving the first and second switching stages respectively. Both switching stages are driven by a LO signal whose frequency is half of the frequency driving a conventional downconversion mixer, as shown in FIG. 1. As a result, the output voltage can be expressed as a product of the input voltage, $V_{RF}$, and the local oscillator voltages of $V_{LO\ (0°)}$ and $V_{LO\ (90°)}$, where the input is the received RF signal and the output is the baseband signal $V_{BB\ I}$. It is important to note that subharmonic mixer 600 produces a standard LO interface of square waves since the product of $V_{LO\ (0°)}$ and $V_{LO\ (90°)}$ is a square wave with amplitude of 1 and period of T.

Similarly, the operation of subharmonic mixer 700 can be described in greater detail with reference to Equation (2) below which relates the output, $V_{BB\ Q}$ to inputs, $V_{RF}$ and $V_{LO}$.

$$V_{BB\ Q}(t) = V_{RF}(t) * V_{LO(45°)}(t) * V_{LO(135°)}(t) \quad \text{Equation 2}$$

Note that $V_{LO(45°)}$ and $V_{LO(135°)}$ are the voltages driving the first, and second switching stages respectively. Both switching stages are driven by a LO signal whose frequency is approximately half of the frequency driving a conventional downconversion mixer, as shown in FIG. 1. As a result, the output voltage can be expressed as a product of the input voltage, $V_{RF}$, and the local oscillator voltages of $V_{LO\ (45°)}$ and $V_{LO(135°)}$, where the input is the received RF signal and the output is the baseband signal $V_{BB\ Q}$. It is important to note that subharmonic mixer 700 produces a standard LO interface of square waves since the product of $V_{LO(45°)}$ and $V_{LO\ (135°)}$ is a square wave with amplitude of 1 and period of T.

Downconversion receivers are described by the receiver's ability to minimize dc offset caused by the LO signal leaking in to the mixer. In a conventional homodyne receiver, since the RF signal is directly downconverted to baseband and the LO signal is also downconverted to baseband, generated dc offsets are often a problem. The LO rejection ("LOR") reflects the receiver's immunity to this problem, and is defined by Equation 3.

$$LOR = \frac{\text{Conversion Gain at } RF \text{ frequency}}{\text{Conversion Gain at } LO \text{ frequency}} \quad \text{Equation 3}$$

In subharmonic mixers of FIGS. 5, 6, and 7, LOR is vastly improved. With a conventional mixer design, as in FIG. 1, LOR=0 dB; With subharmonic mixers 501, 502 of FIG. 5, since the denominator may approach zero, LOR may theoretically approach infinity. When LOR is large, then significant self-mixing does not occur and a significant dc offset is not introduced when downconverting the received signal to baseband. If the phases of the LO signal are matched ideally, then reception of leaked LO radiation will not cause a dc offset problem as in a conventional downconversion mixer. In practice, LOR is not infinite since the transistors and phases may not be perfectly matched and LO harmonics may be coupled to the output but LOR can be obtained substantially eliminating or greatly reducing dc offset.

To summarize, subharmonic mixers 501, 502 provide a number of benefits. First, the use of a subharmonic mixer (501 or 502) allows for receiver design to directly downconvert the received RF signal 520 to baseband without the problem of dc offsets. By taking the current mode received signal and downconverting to an intermediate frequency and then to baseband, the problem of self-mixing and dc offsets is reduced. This is important for two reasons. One reason is that a reduction in dc offset simply results in better performance. The other reason is that by easing the mismatch criteria for the mixer, one reduces the amount of area consumed by resistors, current sources, etc. used to compensate for the mismatch. Second, the subharmonic mixer effectively works as two mixers in series without additional current sources. The subharmonic mixer has the capability of reducing current consumption within the receiver. Each mixer stage consumes current and reducing the number of mixer stages reduces the total amount of current consumed.

Figure 2:
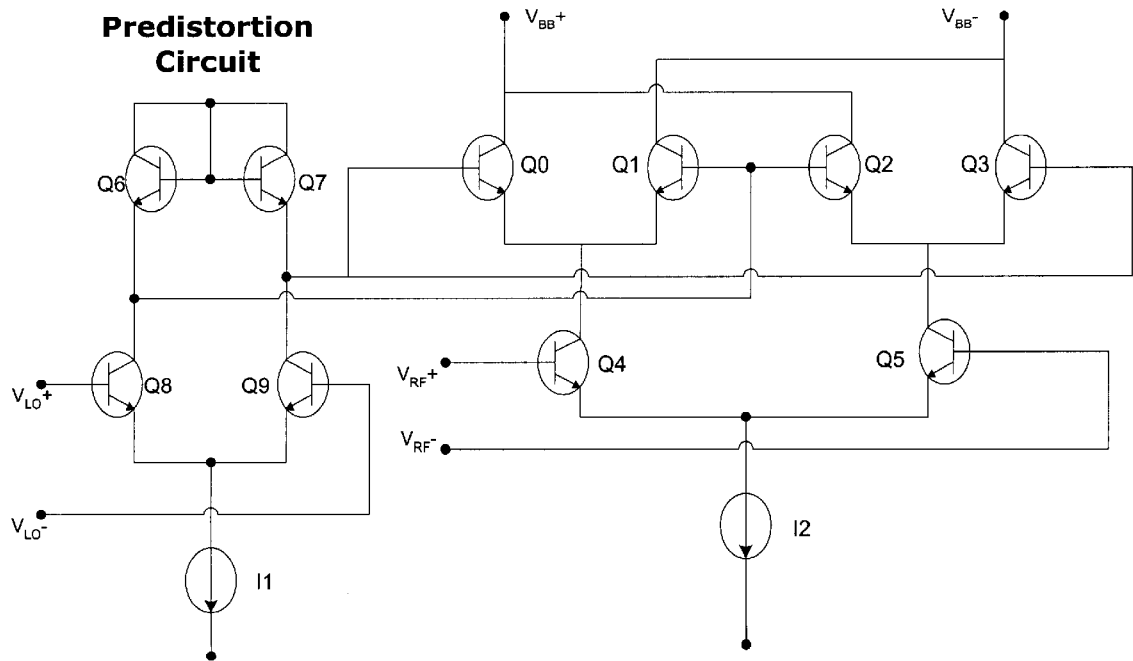
FIG. 2 is an illustration of a prior art Gilbert cell with a predistortion circuit used in RF receivers.
Figure 3:
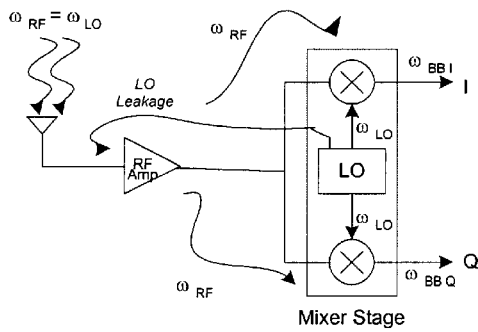
FIG. 3 is an illustration of a prior art direct conversion architecture for a RF receiver.
Figure 4:
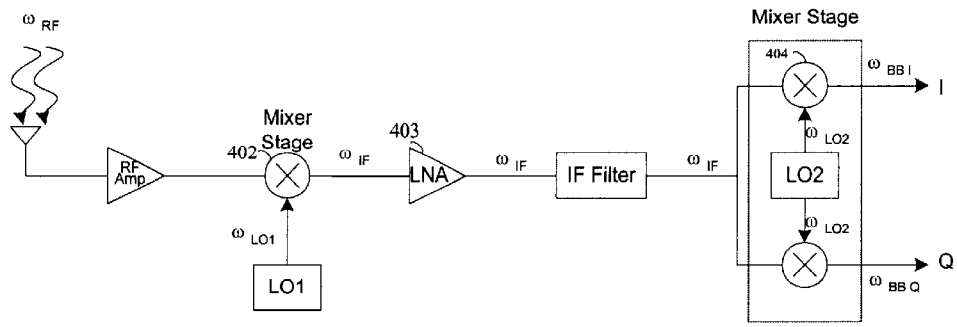
FIG. 4 is an illustration of a prior art super-heterodyne architecture for a RF receiver.

Although the embodiments illustrated in FIGS. 5–7 have been described without reference to a predistortion circuit, as shown in FIG. 2, a subharmonic mixer utilizing a predistortion circuit is contemplated. A predistortion circuit may be useful to linearize either the first, second or both switching stages. Further, the embodiment illustrated in FIGS. 5–7 may include a multi-tanh linearized differential pair to minimize the harmonics coming out of the LO.

While various embodiments of the invention have been described, it will be apparent to those of ordinary skill in the art that many more embodiments and implementations are possible that are within the scope of this invention.

What is claimed is:

1. A subharmonic mixer core comprising:
   a local oscillator interface for receiving a local oscillator signal;
   a broadband output for providing a broadband output signal;
   a first switching stage for receiving a first and second current and the local oscillator signal to supply a third and fourth current responsive to the local oscillator signal; and
   a second switching stage for receiving the third and fourth current and the local oscillator signal, phase shifted from the local oscillator signal in the first switching stage, to supply the broadband output signal responsive to the phase shifted local oscillator signal.

2. The subharmonic mixer of claim 1 wherein the switching stages further comprise two Gilbert cells connected in series, and each cell driven by the local oscillator signal.

3. The subharmonic mixer of claim 1 wherein the local oscillator signal in the first switching stage is phase shifted by substantially 45°.

4. The subharmonic mixer of claim 1 wherein the local oscillator signal in the second switching stage is phase shifted by substantially 90°.

5. A subharmonic mixer comprising:
   a radio frequency (RF) input section for receiving a RF input signal, and having a first and second output to supply a first and second current responsive to the RF input signal; and
   a mixer core having:
      a local oscillator interface for receiving a local oscillator signal,
      a broadband output for providing a broadband output signal,
      a first switching stage for receiving the first and second current and the local oscillator signal to supply a third and fourth current responsive to the local oscillator signal, and
      a second switching stage for receiving the third and fourth current and the local oscillator signal, phase shifted by substantially 90° from the local oscillator signal in the first switching stage, to supply a broadband output signal responsive to the phase shifted local oscillator signal.

6. The subharmonic mixer of claim 5 wherein the input signal is in current mode.

7. The subharmonic mixer of claim 5 wherein the RF input section further comprises a pair of transistors coupled together at a first node for receiving the RF input signal to supply a first and second current responsive to the RF input signal.

8. The subharmonic mixer of claim 5 wherein the switching stages further comprise two Gilbert cells connected in series, and each cell driven by the local oscillator signal.

9. The subharmonic mixer of claim 5 wherein the mixer core produces an inphase component of the RF input signal.

10. The subharmonic mixer of claim 5 wherein the local oscillator signal in the first switching stage is phase shifted by substantially 45°.

11. The subharmonic mixer of claim 10 wherein the mixer core produces a quadrature component of the RF input signal.

12. A subharmonic mixer comprising:
   an input signal representing a received radio frequency (RF) signal coupled to a first input of a first switching stage;
   a local oscillator to supply a local oscillator signal to the first switching stage and to supply the local oscillator signal, phase shifted from the local oscillator signal in the first switching stage, to a second switching stage, where the output of the first switching stage is coupled to the input of the second switching stage; and
   a voltage mode output signal representing the RF signal downconverted to baseband.

13. The subharmonic mixer of claim 12 wherein the local oscillator signal in the second switching stage is phase shifted by substantially 90°.

14. The subharmonic mixer of claim 12 wherein the input signal is in current mode.

15. The subharmonic mixer of claim 12 wherein the switching stages further comprise two Gilbert cells connected in series, and each cell driven by the local oscillator signal.

16. The subharmonic mixer of claim 12 wherein the mixer core produces an inphase component of the RF input signal.

17. The subharmonic mixer of claim 12 wherein the local oscillator signal in the first switching stage is phase shifted by substantially 45°.

18. The subharmonic mixer of claim 17 wherein the mixer core produces a quadrature component of the RF input signal.

19. The subharmonic mixer of claim 12 wherein the local oscillator signal in the second switching stage is phase shifted by substantially 90°.

20. A method for downconverting a received radio frequency (RF) signal comprising the steps of:
   converting the received RF signal to current mode;
   mixing the current mode RF signal with a first local oscillator signal at half the frequency of the RF signal to produce a current mode intermediate frequency signal;

mixing the current mode intermediate frequency signal with a second local oscillator signal, that is phase shifted from the first local oscillator signal, to produce a current mode baseband signal; and converting the current mode baseband signal to voltage mode.

21. The method of downconverting as in claim 20 wherein the first local oscillator signal and second local oscillator signal are produced form the same local oscillator.

22. The method of downconverting as in claim 20 wherein mixing occurs by applying the current mode signal and the local oscillator signal to a Gilbert cell circuit.

23. A system for downconverting a received radio frequency (RF) signal comprising:

means for converting the received RF signal to current mode;

means for mixing the current mode RF signal with a local oscillator signal at half the frequency of the RF signal to produce a current mode intermediate frequency signal;

means for mixing the current mode intermediate frequency signal with a local oscillator signal at half the frequency of the RF signal to produce a current mode baseband signal; and means for converting the current mode baseband signal to voltage mode.

24. The system of downconverting as in claim 23 wherein the means for mixing includes a Gilbert cell circuit.

25. The system of downconverting as in claim 23 wherein the means for converting the received RF signal to current mode includes a pair of differential transistors connected at the bases.

26. The system of downconverting as in claim 23 wherein the means for converting the current mode baseband signal includes using resistive elements to convert the current to voltage.

* * * * *